US006916538B2

(12) United States Patent
Noro et al.

(10) Patent No.: US 6,916,538 B2
(45) **Date of Patent: *Jul. 12, 2005**

(54) THERMOSETTING RESIN COMPOSITION AND SEMICONDUCTOR DEVICE OBTAINED WITH THE SAME

(75) Inventors: Hiroshi Noro, Ibaraki (JP); Mitsuaki Fusumada, Ibaraki (JP)

(73) Assignee: Nitto Denko Corporation, Osaka (JP)

(*) Notice: Subject to any disclaimer, the term of this patent is extended or adjusted under 35 U.S.C. 154(b) by 167 days.

This patent is subject to a terminal disclaimer.

(21) Appl. No.: 10/392,836

(22) Filed: Mar. 21, 2003

(65) Prior Publication Data

US 2003/0219619 A1 Nov. 27, 2003

(30) Foreign Application Priority Data

May 20, 2002 (JP) ....................................... 2002-144080

(51) Int. Cl.[7] ......................... B32B 27/38; H01L 21/56; C08L 63/00

(52) U.S. Cl. ....................... 428/413; 438/127; 523/400; 523/440; 525/523; 525/529; 525/530; 525/533

(58) Field of Search ................................. 438/106, 108, 438/125, 126, 127; 428/413; 523/400, 440; 525/523, 534

(56) References Cited

U.S. PATENT DOCUMENTS

| | | | | |
|---|---|---|---|---|
| 3,791,027 A | | 2/1974 | Angelo et al. | |
| 5,538,789 A | | 7/1996 | Capote et al. | |
| 5,989,362 A | | 11/1999 | Diamant et al. | |
| 6,617,046 B2 | * | 9/2003 | Noro et al. | 428/620 |
| 6,667,194 B1 | * | 12/2003 | Crane et al. | 438/127 |
| 2002/0043728 A1 | * | 4/2002 | Harada | 257/787 |

FOREIGN PATENT DOCUMENTS

| | | |
|---|---|---|
| EP | 1 090 942 A1 | 4/2001 |
| EP | 1 184 419 A2 | 3/2002 |
| TW | 574739 | 2/2004 |

OTHER PUBLICATIONS

European Search Report dated Oct. 8, 2003.

* cited by examiner

*Primary Examiner*—Michael J. Feely
(74) *Attorney, Agent, or Firm*—Sughrue Mion, PLLC

(57) ABSTRACT

A thermosetting resin composition which contains:

(A) an epoxy resin having at least two epoxy groups per molecule;

(B) a hardener;

(C) a compound represented by the following general formula (1) or (2); and (D) a microcapsule type hardening accelerator containing microcapsules each having a structure made up of a core containing a hardening accelerator and a shell covering the core and containing a polymer having a structural unit represented by the following general formula (3), and which, when examined by differential scanning calorimetry at a heating rate of 10° C./min, shows an exothermic peak due to reaction in the range of from 180 to 250° C., and a semiconductor device obtained through sealing with the composition are described.

24 Claims, 2 Drawing Sheets

THERMOSETTING RESIN COMPOSITION AND SEMICONDUCTOR DEVICE OBTAINED WITH THE SAME

FIELD OF THE INVENTION

The present invention relates to a thermosetting resin composition for use in semiconductor device production for sealing so as to fill the space between a wiring board and a semiconductor element, and to a semiconductor device obtained through sealing with the thermosetting resin composition.

BACKGROUND OF THE INVENTION

With recent improvements in semiconductor devices, there is a desire for techniques for mounting a semiconductor element on a wiring board to form a face-down structure (e.g., flip chip method or direct chip attachment method). The flip chip method has a problem concerning the reliability of connecting parts because a semiconductor element and a wiring board, which differ from each other in coefficient of linear expansion, are directly connected to each other electrically. A technique which is being employed as a measure in eliminating this problem comprises filling the space between a semiconductor element and a wiring board with a liquid resin material and curing the material to form a cured resin. Thus, the stress concentrating on the electrical connecting parts is dissipated into the cured resin to thereby improve connection reliability. In the flip chip method employing solder bumps, the technique heretofore in use for filling with a liquid material comprises first mounting a flip chip on a wiring board to form metallic junctions through a solder melting step and then injecting a liquid resin material into the space between the semiconductor element and the wiring board based on a capillary effect. This process for semiconductor device production has a problem that the productivity is low because it involves many production steps.

SUMMARY OF THE INVENTION

An object of the invention, which has been achieved under the circumstances described above, is to provide a thermosetting resin composition which functions to remove a metal oxide film or oxidation-inhibitive film (hereinafter referred to as preflux) present on a semiconductor element or on the surface of the electrodes of a wiring board in semiconductor device production necessitating the formation of metallic junctions such as solder bumps and which can be applied prior to flip chip mounting to thereby attain excellent productivity. Another object of the invention is to provide a semiconductor device obtained through sealing with the composition.

The invention provides

[1] a thermosetting resin composition which comprises:

(A) an epoxy resin having at least two epoxy groups per molecule;

(B) a hardener;

(C) a compound represented by the following general formula (1) or (2):

$$R^1\text{—}(COO\text{—}CH(CH_3)\text{—}O\text{—}R^2)_n \quad (1)$$

$$CH_2{=}CH\text{—}O\text{—}R^4\text{—}O\text{—}CH(CH_3)\text{—}(OCO\text{—}R^3\text{—}COO\text{—}CH(CH_3)\text{—}OR^4\text{—}O\text{—}CH(CH_3)_n\text{—}OCO\text{—}R^3\text{—}COO\text{—}CH(CH_3)\text{—}OR^4\text{—}O\text{—}CH{=}CH_2 \quad (2)$$

wherein n is a positive integer, and $R^1$, $R^2$, $R^3$, and $R^4$ each represent an organic group having a valence of 1 or higher and may be the same or different; and (D) a microcapsule type hardening accelerator comprising microcapsules each having a structure made up of a core comprising a hardening accelerator and a shell covering the core and comprising a polymer having a structural unit represented by the following general formula (3):

$$\text{—}N(R^5)\text{—}CO\text{—}N(R^6)\text{—} \quad (3)$$

wherein $R^5$ and $R^6$ each represent a hydrogen atom or a monovalent organic group and may be the same or different, and which, when examined by differential scanning calorimetry at a heating rate of 10° C./min, shows an exothermic peak due to reaction in the range of from 180 to 250° C.

The invention further provides

[2] a semiconductor device obtained through sealing with the thermosetting resin composition described in [1] above.

DESCRIPTION OF REFERENCE NUMERALS

Figure 1:
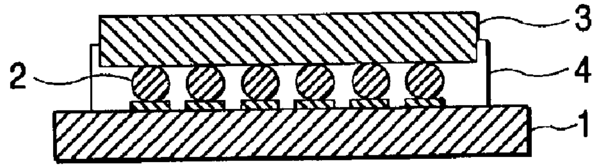
FIG. 1 is a diagrammatic sectional view illustrating one embodiment of the semiconductor device.

1 wiring board
2 connecting electrode part
3 semiconductor element
4 sealing resin layer
5 preflux-coated copper plate
6 solder ball
7 thermosetting resin composition

DETAILED DESCRIPTION OF THE INVENTION

The thermosetting resin composition of the invention is characterized by comprising ingredients (A) to (D) and showing an exothermic peak due to reaction in the range of from 180 to 250° C. when examined by differential scanning calorimetry at a heating rate of 10° C./min.

The epoxy resin to be used as ingredient (A) in the invention is not particularly limited as long as it has at least two epoxy groups per molecule. Examples thereof include bisphenol A epoxy resins, bisphenol F epoxy resins, novolac epoxy resins such as phenol-novolac epoxy resins and cresol-novolac epoxy resins, alicyclic epoxy resins, nitrogen-containing ring epoxy resins such as triglycidyl isocyanurate and hydantoin epoxy resins, hydrogenated bisphenol A epoxy resins, aliphatic epoxy resins, glycidyl ether epoxy resins, bisphenol S epoxy resins, and biphenyl epoxy resins, dicyclo epoxy resins, and naphthalene epoxy resins, which are mainly used as epoxy resins of the type giving cured resins reduced in water absorption. These epoxy resins may be used alone or in combination of two or more thereof.

Preferred of those epoxy resins are bisphenol A epoxy resins, bisphenol F epoxy resins, naphthalene epoxy resins, alicyclic epoxy resins, and triglycidyl isocyanurate which themselves are liquid at room temperature.

Although those epoxy resins may be solid or liquid at ordinary temperature, it is generally preferred to use one having an epoxy equivalent of from 90 to 1,000 g/eq from the standpoint of regulating the mechanical strength and glass transition temperature of the cured resin to be obtained from the thermosetting resin composition. In the case of using a solid epoxy resin, this resin preferably is one having a softening point of from 50 to 160° C. from the standpoint of a temperature range in which the latent activity of the latent hardening accelerator is maintained.

The hardener as ingredient (B) is not particularly limited, and any of various hardeners can be used as long as it functions as a hardener for the epoxy resin. Although a phenolic hardener is generally used as the hardener for the epoxy resin, use may be made of any of various acid anhydride hardeners, amines, benzoxazine ring compounds, and the like. These may be used alone or in combination of two or more thereof.

Examples of the phenolic hardener include cresol novolac resins, phenolic novolac resins, dicyclopentadiene ring phenolic resins, phenol-aralkyl resins, and naphthol. These may be used alone or in combination of two or more thereof.

The epoxy resin and the phenolic hardener are incorporated preferably in such ratios that the amount of the reactive hydroxyl groups in the phenolic hardener is from 0.5 to 1.5 equivalent, preferably from 0.7 to 1.2 equivalent, per equivalent of the epoxy groups of the epoxy resin from the standpoints of curability, heat resistance, and reliability concerning moisture resistance. In the case of using a hardener other than phenolic hardeners, the ratio thereof (equivalent ratio) may be the same as in the case of using phenolic hardeners.

Ingredient (C) to be contained in the thermosetting resin composition of the invention is a compound represented by the following general formula (1) or (2):

$$R^1\text{—}(COO\text{—}CH(CH_3)\text{—}O\text{—}R^2)_n \quad (1)$$

$$CH_2{=}CH\text{—}O\text{—}R^4\text{—}O\text{—}CH(CH_3)\text{—}(OCO\text{—}R^3\text{—}COO\text{—}CH(CH_3)\text{—}OR^4\text{—}O\text{—}CH(CH_3))_n\text{—}OCO\text{—}R^3\text{—}COO\text{—}CH(CH_3)\text{—}OR^4\text{—}O\text{—}CH{=}CH_2 \quad (2)$$

wherein n is a positive integer, and $R^1$, $R^2$, $R^3$, and $R^4$ each represent an organic group having a valence of 1 or higher and may be the same or different. This compound serves as a flux activator. The term flux activator herein means an agent which imparts to the thermosetting resin composition the ability in soldering to remove an oxide film, organic substances, etc. from the metal surfaces to be bonded, to prevent oxidation from proceeding during heating, and to lower the surface tension of the molten solder.

The compound represented by general formula (1) or (2) can be obtained by reacting a carboxylic acid with a vinyl ether compound. Examples of the carboxylic acid include acetic acid, adipic acid, maleic acid, fumaric acid, itaconic acid, phthalic acid, trimellitic acid, pyromellitic acid, acrylic acid, isocyanuric acid, and carboxyl group-containing polybutadiene. Examples of the vinyl ether ingredient include vinyl ethers having an organic group having a valence of 1 or higher, such as butyl, ethyl, propyl, isopropyl, cyclohexyl, or allyl.

Examples of $R^1$ in general formula (1) include alkyl groups having 1 to 30 carbon atoms, alkylene groups having 2 to 8 carbon atoms, vinyl, allyl, phenyl, phenylene, aromatic ring groups having a valence of 3 or higher, and a $C_3N_3(OCOC_2H_4)_3$ group. Examples of $R^2$ in general formula (1) include alkyl groups having 1 to 10 carbon atoms, cycloalkyl groups having 3 to 8 carbon atoms, and aromatic ring groups.

Examples of $R^3$ in general formula (2) include functional groups having a structure represented by any of formulae (4) to (7):

$$\text{—}(CH_2)_n\text{—} \quad (4)$$

(5)

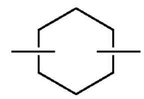

(6)

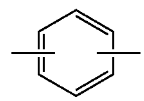

(7)

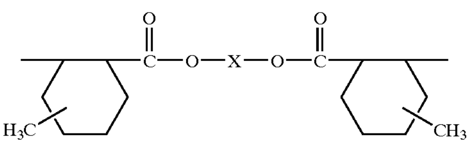

wherein n is a positive integer and X is a bivalent organic group.

Examples of $R^4$ in general formula (2) include functional groups having a structure represented by any of formulae (8) to (10):

$$\text{—}(CH_2)_n\text{—} \quad (8)$$

(9)

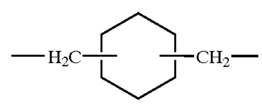

$$\text{—}(CH_2CH_2O)_n\text{—} \quad (10)$$

wherein n is a positive integer.

This compound, in a semiconductor-mounting process, exhibits flux activity and then thermally decomposes to generate a free carboxylic acid, which is capable of reacting with the epoxy resin. Consequently, this compound can be advantageously used as a material combining the function of a flux activator and the function of a hardener. The temperature at which a free carboxylic acid is to be generated can be suitably regulated by selecting a combination of a carboxylic acid and a vinyl ether compound according to the melting temperatures of various metal bumps. Compounds represented by general formula (1) and (2) may be used alone or in combination of two or more thereof.

The proportion of the compound (C) represented by general formula (1) or (2) in the thermosetting resin composition of the invention is preferably from 0.1 to 20 parts by weight, more preferably from 0.5 to 15 parts by weight, particularly preferably from 1 to 10 parts by weight, per 100 parts by weight of all resins from the standpoints of suitability for solder jointing, heat resistance, and reliability concerning moisture resistance. The term "100 parts by weight of all resins" as used herein means 100 parts by weight of the sum of the weight of the ingredients, such as an epoxy resin, a hardener, a catalyst, a synthetic rubber and a reactive diluent, which constitute the thermosetting resin composition of the invention.

The microcapsule type hardening accelerator used as ingredient (D) in the invention has a core/shell structure made up of a core comprising any of various hardening accelerators and a shell covering the core and comprising a polymer having a structural unit represented by the following general formula (3):

$$—N(R^5)—CO—N(R^6)— \quad (3)$$

wherein $R^5$ and $R^6$ each represent a hydrogen atom or a monovalent organic group and may be the same or different. This microcapsule type curing accelerator preferably is one in which the reactive amino groups present in the shells have been blocked.

The thermosetting resin composition, which contains the microcapsule type hardening accelerator, is inhibited from gelling in a soldering step because the shells prevent the cores from coming into physical contact with the hardener. The composition thus brings about satisfactory solderability. Use of this hardening accelerator further has an advantage that it can inhibit the thermosetting resin composition from undesirably curing in storage, etc. and, hence, enables the composition to have an exceedingly prolonged pot life and excellent storage stability.

In the microcapsule type hardening accelerator, the hardening accelerator encapsulated as cores is not particularly limited as long as it functions to accelerate a curing reaction. Although hardening accelerators for ordinary use may be used, it is preferred to employ one which is liquid at room temperature from the standpoints of workability in microcapsule preparation and properties of the microcapsules. The term “liquid at room temperature” implies not only the case of a hardening accelerator which itself has a liquid nature at room temperature (25° C.) but also a hardening accelerator which is solid at room temperature but has been liquefied by being dissolved or dispersed in any desired organic solvent or the like.

Examples of the hardening accelerator serving as the cores include tertiary amines such as 1,8-diazabicyclo[5.4.0] undecene-7, triethylenediamine, and tri-2,1,6-dimethylaminomethylphenol, imidazole compounds such as 2-ethyl-4-methylimidazole and 2-methylimidazole, phosphorus compounds such as triphenylphosphine, tetraphenylphosphonium tetraphenylborate, and tetra-n-butylphosphonium O,O-diethylphosphorodithioate, quaternary ammonium salts, organometallic salts, and derivatives thereof. These may be used alone or in combination of two or more thereof. Especially preferred of these are the imidazole compounds and organophosphorus compounds from the standpoints of ease of the preparation of hardening accelerator-containing microcapsules and ease of handling.

The polymer having a structural unit represented by general formula (3) is obtained, for example, by the addition polymerization reaction of a polyisocyanate with a polyamine. Alternatively, the polymer can be obtained by reacting a polyisocyanate with water.

The polyisocyanate is not particularly limited as long as it is a compound having two or more isocyanate groups in the molecule. Examples thereof include diisocyanates such as m-phenylene diisocyanate, p-phenylene diisocyanate, 2,4-tolylene diisocyanate, 2,6-tolylene diisocyanate, naphthalene 1,4-diisocyanate, diphenylmethane 4,4'-diisocyanate, 3,3'-dimethoxy-4,4'-biphenyl diisocyanate, 3,3'-dimethyldiphenylmethane 4,4'-diisocyanate, xylylene 1,4-diisocyanate, 4,4'-diphenylpropane diisocyanate, trimethylene diisocyanate, hexamethylene diisocyanate, propylene 1,2-diisocyanate, butylene 1,2-diisocyanate, cyclohexylene 1,2-diisocyanate, and cyclohexylene 1,4-diisocyanate, triisocyanates such as p-phenylene diisothiocyanate, xylylene 1,4-diisothiocyanate, and ethylidyne diisothiocyanate, tetraisocyanates such as 4,4'-dimethyldiphenylmethane 2,2',5,5'-tetraisocyanate, an adduct of 2,4-hexamethylene diisocyanate with Brenzcatechol, an adduct of tolylene diisocyanate with hexanetriol, an adduct of tolylene diisocyanate with trimethylolpropane, an adduct of xylylene diisocyanate with trimethylolpropane, an adduct of hexamethylene diisocyanate with trimethylolpropane, and isocyanate prepolymers such as trimers of aliphatic polyisocyanates, e.g., triphenyldimethylene triisocyanate, tetraphenyltrimethylene tetraisocyanate, pentaphenyltetramethylene pentaisocyanate, lysine isocyanate, and hexamethylene diisocyanate. These may be used alone or in combination of two or more thereof.

Preferred of those polyisocyanates is a trivalent isocyanate prepolymer which is either an adduct of tolylene diisocyanate with trimethylolpropane or an adduct of xylylene diisocyanate with trimethylolpropane, from the standpoints of film-forming properties in microcapsule preparation and mechanical strength. Furthermore, triphenyldimethylene triisocyanate also can be used as a preferred polyisocyanate.

The polyamine to be reacted with the polyisocyanate is not particularly limited as long as it is a compound having two or more amino groups in the molecule. Examples thereof include diethylenetriamine, triethylenetetramine, tetraethylenepentamine, 1,6-hexamethylenediamine, 1,8-octamethylenediamine, 1,12-dodecamethylenediamine, o-phenylenediamine, m-phenylenediamine, p-phenylenediamine, o-xylylenediamine, m-xylylenediamine, p-xylylenediamine, menthanediamine, bis(4-amino-3-methylcyclohexyl)methane, isophoronediamine, 1,3-diaminocyclohexane, and spiroacetal-series diamines. These may be used alone or in combination of two or more thereof.

In the reaction of a polyisocyanate with water, an amine is first formed by the hydrolysis of the polyisocyanate and this amine reacts with the isocyanate groups remaining unreacted (so-called self-polyaddition reaction) to thereby yield a polymer having structural units represented by general formula (3).

Examples of the polymer constituting the shells further include a polyurethane-polyurea which has, besides those structural units, urethane bonds formed by using a polyhydric alcohol in combination with the polyisocyanate.

The polyhydric alcohol may be any of aliphatic, aromatic, and alicyclic ones. Examples thereof include catechol, resorcinol, 1,2-dihydroxy-4-methylbenzene, 1,3-dihydroxy-5-methylbenzene, 3,4-dihydroxy-1-methylbenzene, 3,5-dihydroxy-1-methylbenzene, 2,4-dihydroxyethylbenzene, 1,3-naphthalenediol, 1,5-naphthalenediol, 2,7-naphthalenediol, 2,3-naphthalenediol, o,o'-diphenol, p,p'-diphenol, bisphenol A, bis(2-hydroxyphenyl)methane, xylylenediol, ethylene glycol, 1,3-propylene glycol, 1,4-butylene glycol, 1,5-pentanediol, 1,6-hexanediol, 1,7-heptanediol, 1,8-octanediol, 1,1,1-trimethylolpropane, hexanetriol, pentaerythritol, glycerol, and sorbitol. These may be used alone or in combination of two or more thereof.

Examples of $R^5$ and $R^6$ in general formula (3) include a hydrogen atom and monovalent organic groups such as alkyl groups having 1 to 3 carbon atoms and aryl groups.

The shells may contain a polymer or thermoplastic polymer having urethane bonds or another polymer besides the polymer having a structural unit represented by general formula (3).

The polymer having a structural unit represented by general formula (3) accounts for preferably from 40 to 100% by weight, more preferably from 60 to 100% by weight, of the shells.

The microcapsule type hardening accelerator can be produced, for example, through the following three steps.

[First Step]

A hardening accelerator as a core ingredient is dissolved or finely dispersed in a polyisocyanate as a starting material for shells to form an oil phase. Subsequently, this oil phase is dispersed in the form of droplets into an aqueous medium (aqueous phase) containing a dispersion stabilizer to produce an oil-in-water type (O/W) emulsion. A polyamine is added to and dissolved in the aqueous phase of this O/W emulsion to thereby cause the amine to undergo interfacial polymerization and polyaddition reaction with the polyisocyanate contained in the oil phase. Alternatively, the O/W emulsion is heated to thereby cause the polyisocyanate contained in the oil phase to react with water at the interface between the oil phase and the aqueous phase to yield an amine and successively cause this amine to undergo a self-polyaddition reaction. Thus, a microcapsule dispersion is obtained which contains microcapsules in which the sells are made of a polyurea polymer, preferably a polyurea having structural units represented by general formula (3).

On the other hand, in the case where a solid hardening accelerator is dissolved in an organic solvent to prepare a solution serving as a core ingredient, an S/O/W (solid phase/oil phase/aqueous phase) type emulsion is obtained. This emulsion type is obtained when the hardening accelerator is oleophilic. Although use of a hydrophilic hardening accelerator is less apt to result in that emulsion type, an O/O (oil phase/oil phase) type or S/O/O (solid phase/oil phase/oil phase) type emulsion to be subjected to interfacial polymerization may be prepared by solubility regulation.

The organic solvent for use in this step is not particularly limited as long as it is liquid at room temperature. It is, however, necessary to select an organic solvent in which at least the shells do not dissolve. Examples thereof include organic solvents such as ethyl acetate, methyl ethyl ketone, acetone, methylene chloride, xylene, toluene, and tetrahydrofuran. Also usable besides these are oils such as phenylxylylethane and dialkylnaphthalenes.

[Second Step]

A blocking agent is added to the microcapsule dispersion obtained in the first step, and is dissolved or dispersed therein. An effective method for this step is to add the blocking agent after the dispersion stabilizer and unreacted amine present in the aqueous phase have been removed by centrifuging or another technique.

[Third Step]

The microcapsule dispersion in which the amino groups have been blocked with the blocking agent in the second step is centrifuged, filtered, or otherwise treated to remove the excess blocking agent and then dried. Thus, a microcapsule type hardening accelerator in a powder form can be produced.

Examples of the dispersion stabilizer to be added to the aqueous medium (aqueous phase) in the first step include water-soluble polymers such as poly(vinyl alcohol) and hydroxymethyl cellulose, anionic surfactants, nonionic surfactants, and cationic surfactants. Also usable are hydrophilic inorganic colloidal substances such as colloidal silica and clay minerals. The amount of such as a dispersion stabilizer to be added is preferably such that the concentration thereof in the aqueous phase is from 0.1 to 10% by weight.

The blocking agent to be used in the second step is not particularly limited as long as it is a compound reactive with amino groups. Examples thereof include compounds which react with an amino group to form a covalent bond, such as epoxy compounds, aldehyde compounds, acid anhydrides, ester compounds, and isocyanate compounds. Examples thereof further include acid compounds which undergo a neutralization reaction with an amino group to form a salt, such as organic carboxylic acids, e.g., acetic acid, formic acid, lactic acid, and succinic acid, organic sulfonic acids, e.g., p-toluenesulfonic acid, 2-naphthalenesulfonic acid, and dodecylbenzenesulfonic acid, phenol compounds, inorganic acids, e.g., boric acid, phosphoric acid, nitric acid, nitrous acid, and hydrochloric acid, and solid substances having an acid surface, e.g., silica and Aerosil. Preferred of these compounds are the acid compounds because they effectively block the amino groups present on the surface of the shells and in the inner parts of the shells. Especially preferred are formic acid and the organic sulfonic acids.

The blocking agent is added in an amount equimolar with the amino groups present on the surface of the shells and in the inner parts of the shells. For example, a practical method in the case of using an acid compound as the blocking agent comprises adding the acid substance (acid compound) to the dispersion just after the microcapsule preparation (interfacial polymerization) to regulate the pH of the dispersion, which is in a basic region, to a value in an acid region, preferably to 2 to 5, and then removing the excess acid compound by a treatment such as, e.g., centrifuging or filtration.

In the second step, a technique may be used in which the microcapsule dispersion is passed through a column of an acid cation-exchange resin to thereby remove free amino groups remaining unreacted or neutralize residual amino groups.

The average particle diameter of the microcapsule type hardening accelerator to be obtained is not particularly limited. However, the average particle diameter thereof is, for example, preferably in the range of from 0.05 to 500 $\mu$m, more preferably from 0.1 to 30 $\mu$m, from the standpoint of the property of being evenly dispersed. The shape of the microcapsule type hardening accelerator preferably is spherical, but may be ellipsoidal. In the case where the shape of the microcapsule type hardening accelerator is not truly spherical but is one whose diameter cannot be unconditionally fixed, as in an ellipsoidal or flat shape, the simple average of the major axis and the minor axis of the shape is taken as the average particle diameter.

In the microcapsule type hardening accelerator, the amount of the hardening accelerator encapsulated as the cores is preferably from 5 to 80% by weight, especially preferably from 10 to 60% by weight, based on the whole microcapsules from the standpoints of reactivity in a hardening reaction, insulation of the cores, and mechanical strength.

The proportion of the thickness of the shells to the particle diameter of the microcapsule type hardening accelerator is preferably from 3 to 25%, especially preferably from 5 to 25%, from the standpoint of mechanical strength.

The amount of the microcapsule type hardening accelerator to be incorporated as ingredient (D) in the thermosetting resin composition may be suitably selected so as to impart a desired hardening rate to the thermosetting resin composition while taking account of suitability for soldering and adhesion. For example, the amount of the microcapsule type hardening accelerator to be used can be easily determined through an examination of gel time, as an index to hardening rate, on a hot platen. In general, the amount thereof is preferably from 0.1 to 40 parts by weight, especially preferably from 1 to 20 parts by weight, per 100 parts by weight of the hardener. In case where the amount of the microcapsule type hardening accelerator is smaller than 0.1 part by weight, the thermosetting resin composition not only has a considerably reduced hardening rate to necessitate a prolonged period for hardening but also gives a cured resin having a considerably lowered glass transition temperature. This cured resin may impair the reliability of the electronic device employing the same. Conversely, in case where the microcapsule type hardening accelerator is incorporated in an amount larger than 40 parts by weight, there is a possibility that suitability for soldering and adhesion might be reduced because the composition has an exceedingly high hardening rate.

The thermosetting resin composition of the invention, when examined by differential scanning calorimetry at a heating rate of 10° C./min, shows an exothermic peak due to reaction in the range of from 180 to 250° C.

Differential scanning calorimetry is a technique in which a sample and a reference are kept under the same conditions by heating or cooling and the energy necessary for keeping the temperature difference between the sample and the reference zero is recorded against time or temperature.

In the invention, the exothermic peak due to reaction to be observed in analysis of the thermosetting resin composition, which contains the microcapsule type hardening accelerator, by differential scanning calorimetry (DSC) can be regulated by suitably selecting constituent ingredients for the shells of the accelerator. The reasons for the necessity of this regulation are as follows. The thermal hardening reaction of the thermosetting resin composition of the invention, which contains the microcapsule type hardening accelerator, is based on the initiation of an exothermic reaction caused by the swelling of the shells upon heating and the resultant release of the hardening accelerator from the capsules into the thermosetting resin and on the acceleration of the reaction by shell decomposition due to the heat of reaction. Because of this, a crosslink density in the shells, more specifically the number of functional groups, number of aromatic rings, etc. in the isocyanate monomer to be used as a constituent ingredient for the shells, is suitably selected, whereby the thermosetting resin composition containing the microcapsules can be suitably regulated with respect to the heat of reaction. In case where the composition in differential scanning calorimetry has an exothermic peak due to reaction at a temperature lower than 180° C., this exothermic-peak temperature is lower than the melting points of, for example, 63Sn-37Pb solder (melting point: 183° C.) and Sn—Ag solder (melting point: 220° C.). Consequently, the resin thickens or gels during solder reflow, i.e., before soldering, to thereby impair solderability. Incidentally, to regulate thermosetting epoxy resin compositions containing a microcapsule type hardening accelerator so as to show an exothermic peak due to reaction at a temperature higher than 250° C. is generally extremely difficult at present because of the heat resistance of the shells.

Other materials (organic materials and inorganic materials) may be added to the thermosetting resin composition of the invention according to need. Examples of the organic materials include silane coupling agents, titanate coupling agents, surface modifiers, antioxidants, and tackifiers. Examples of the inorganic materials include various fillers such as alumina, silica, and silicon nitride and particles of metals such as copper, silver, aluminum, nickel, and solders. Other examples of those optional materials include pigments and dyes. Although the amount of such an inorganic material to be incorporated is not particularly limited, the proportion thereof is desirably from 0 to 70% by weight, preferably from 0 to 65% by weight, based on the whole composition from the standpoints of regulating the viscosity of the thermosetting resin composition and of the electrical connection of a semiconductor element to a wiring board.

The thermosetting resin composition of the invention may be modified so as to attain a low stress by incorporating, besides the additives shown above, an ingredient selected from silicone oils, silicone rubbers, synthetic rubbers, reactive diluents, and the like. An ion-trapping agent such as, e.g., a hydrotalcite or bismuth hydroxide may also be incorporated for the purpose of improving reliability in a high-humidity reliability test. Furthermore, various known additives such as, e.g., deterioration inhibitors, leveling agents, defoamers, dyes, and pigments can be suitably incorporated.

The thermosetting resin composition of the invention may be either liquid or solid at room temperature (25° C.), and may be applied after having been formed into a sheet. In the case where the thermosetting resin composition is liquid at room temperature, a dispenser may be used for applying the composition to a wiring board. In the case where the thermosetting resin composition is solid at room temperature, a heating dispenser may be used to melt the thermosetting resin composition and apply the melt of the composition to a wiring board.

In the case where the thermosetting resin composition of the invention is to be applied in a sheet form, a sheet of the thermosetting resin composition can be obtained by thermally melting the composition and extruding the melt onto a substrate film. For facilitating sheet formation, a rubber ingredient or the like may be added to the thermosetting resin composition.

The rubber ingredient preferably is, for example, an acrylonitrile/butadiene copolymer (NBR). An acrylonitrile/butadiene copolymer having units or segments derived from one or more other copolymerizable ingredients may also be used. Examples of such copolymerizable ingredients include a hydrogenated acrylonitrile/butadiene rubber, acrylic acid, acrylic esters, styrene, and methacrylic acid. Preferred of these are acrylic acid and methacrylic acid from the standpoint of excellent adhesion to metals and plastics. The combined acrylonitrile content in the NBR is preferably from 10 to 50% by weight, especially preferably from 15 to 40% by weight.

The thermosetting resin composition of the invention can be produced, for example, in the following manner. An epoxy resin, a hardener, a compound represented by general formula (1) or (2), and the microcapsule type hardening accelerator are mixed together in respective given amounts and melt-kneaded with a kneading machine, e.g., a universal stirring tank. Subsequently, this melt is filtered through a filter and then degassed under vacuum. Thus, the target thermosetting resin composition can be produced. An organic solvent can be added in order to regulate the flowability of the thermosetting resin composition. Examples of the organic solvent include toluene, xylene, methyl ethyl ketone (MEK), acetone, and diacetone alcohol. These may be used alone or in combination of two or more thereof.

The invention further provides a semiconductor device obtained through sealing with the thermosetting resin composition described above.

The semiconductor device produced with the thermosetting resin composition of the invention may have a structure which comprises, as shown in FIG. 1, a wiring board 1 and a semiconductor element 3 mounted on one side of the wiring board 1 through plurality of connecting electrode parts 2. A sealing resin layer 4 has been formed between the wiring board 1 and the semiconductor element 3.

The plurality of connecting electrode parts 2 which electrically connect the wiring board 1 to the semiconductor element 3 may be ones which have been disposed beforehand on the wiring board 1 or on the semiconductor element 3. The connecting electrode parts 2 may also be ones which have been formed beforehand on each of the wiring board 1 and the semiconductor element 3.

The material of the substrate of the wiring board 1 is not particularly limited, and examples thereof are roughly classified into ceramic substrates and plastic substrates. Examples of the plastic substrates include epoxy substrates, bismaleimide-triazine substrates, and polyimide substrates. Even in such a case where a high soldering temperature cannot be used because of limited heat resistance, as in a combination of a plastic substrate and connecting electrode parts made of a low-melting solder, the thermosetting resin composition of the invention can be advantageously used without particular limitations.

The material of the plurality of connecting electrode parts 2 is not particularly limited. Examples thereof include low-melting or high-melting solder bumps, tin bumps, silver-tin bumps, and silver-tin-copper bumps. In the case where the electrode parts disposed on the wiring board are made of any of these materials, the connecting electrode parts 2 may be gold bumps, copper bumps, or the like.

The semiconductor element 3 is not particularly limited and can be one for ordinary use. For example, various semiconductors may be used, such as elementary semiconductors including silicon and germanium and compound semiconductors including gallium arsenide and indium phosphide.

A process for producing the semiconductor device obtained with the thermosetting resin composition of the invention is as follows. In the case where the semiconductor device is one which comprises a wiring board and a semiconductor element mounted thereon through plurality of connecting electrode parts and in which the space between the wiring board and the semiconductor element has been tightly filled with a sealing resin layer, the process for producing this device includes a step in which the thermosetting resin composition is interposed between the wiring board and the semiconductor element and this composition is melted to form the sealing resin layer. An example of processes for producing the semiconductor device of the invention will be explained below according to the order of steps with reference to drawings.

Figure 2:
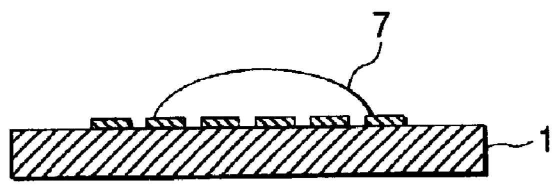
FIG. 2 is a diagrammatic sectional view illustrating one step in producing the semiconductor device.
Figure 3:
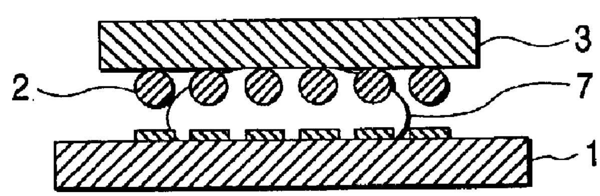
FIG. 3 is a diagrammatic sectional view illustrating another step in producing the semiconductor device.

First, the thermosetting resin composition 7 of the invention is placed on a wiring board 1 as shown in FIG. 2. Subsequently, a semiconductor element 3 having plurality of connecting electrode parts (joint balls) 2 is placed over the thermosetting resin composition in a given position as shown in FIG. 3. The thermosetting resin composition 7 is melted by heating on a heating stage. The connecting electrode parts 2 of the semiconductor element 3 are caused to push aside the thermosetting resin composition 7 in a molten state and come into contact with the wiring board 1. Simultaneously therewith, the molten-state thermosetting resin composition 7 is caused to fill the space between the semiconductor element 3 and the wiring board 1. Thereafter, metallic junctions are formed through solder reflow and the thermosetting resin composition 7 is then hardened to thereby tightly fill the space and form a sealing resin layer 4. This solder reflow may be conducted by a junction-forming method using a reflow oven or by a junction-forming method in which simultaneously with the chip placement, a heater part is heated to a temperature not lower than the melting point of the solder to melt the solder. In this manner, the semiconductor device shown in FIG. 1 is produced.

Although a semiconductor element 3 having plurality of connecting electrode parts 2 was used in the semiconductor device production process described above, production processes usable for the semiconductor device of the invention should not be construed as being limited thereto. Use may be made of a wiring board 1 on which plurality of connecting electrode parts 2 have been formed beforehand.

The thickness and weight of the thermosetting resin composition 7 are suitably determined according to the size of the semiconductor element 3 to be mounted and the size of the spherical connecting electrodes formed on the semiconductor element, i.e., according to the volume of the sealing resin layer 4 to be formed by tightly filling the space between the semiconductor element 3 and the wiring board 1, as in the case described above.

In the semiconductor device production process described above, the temperature to which the thermosetting resin composition 7 is heated for melting is suitably determined while taking account of the heat resistance of the semiconductor element 3 and wiring board 1, melting point of the connecting electrode parts 2, softening point and heat resistance of the thermosetting resin composition 7, etc.

The epoxy resin, hardener, flux activator, microcapsule type hardening accelerators, hardening accelerator, and inorganic filler shown below were prepared prior to Examples and Comparative Examples.

[Epoxy Resin]

Bisphenol A epoxy resin (epoxy equivalent, 185 g/eq)

[Hardener]

Cresol novolac resin (hydroxyl equivalent, 104 g/eq)

[Flux Activator]

Adipic acid/cyclohexanedimethanol/divinyl ether polymer (acid equivalent, 280 g/mol; average molecular weight (Mn), 1300)

[Microcapsule Type Hardening Accelerators (a) to (e)]

The microcapsule type hardening accelerators (a) to (e) shown in Table 1 were produced by the method described above. First, the ingredients shown below were prepared and mixed according to each of the formulations shown in Table 1.

<Isocyanate Monomers>

(X) Ethyl acetate solution (75% by weight) of adduct of 3 mol of tolylene diisocyanate with 1 mol of trimethylolpropane (Y) Ethyl acetate solution (75% by weight) of adduct of 3 mol of xylylene diisocyanate with 3 mol of trimethylolpropane (Z) Polyphenylene polyisocyanate <Polyamine>

Diethylenetriamine

<Dispersion Stabilizer>

Poly(vinyl alcohol) (PVA)

<Hardening Accelerator>

Triphenylphosphine (TPP)

A given isocyanate monomer solution in ethyl acetate and triphenylphosphine (TPP) were evenly dissolved in toluene to prepare an oil phase. Subsequently, an aqueous phase consisting of distilled water and poly(vinyl alcohol) (PVA) was separately prepared. The oil phase was added to this aqueous phase and the resultant mixture was emulsified by treatment with a homomixer to obtain an emulsion. This emulsion was charged into a polymerizer equipped with a reflux condenser, stirrer, and dropping funnel. On the other hand, an aqueous solution containing diethylenetriamine (DTA) was prepared. This solution was introduced into the dropping funnel fitted to the polymerizer, and was dropped into the emulsion in the polymerizer to conduct interfacial polymerization at 70° C. for 3 hours and thereby obtain an aqueous suspension of a microcapsule type hardening accelerator. This suspension was centrifuged to remove the poly (vinyl alcohol) and other ingredients present in the aqueous phase. Thereafter, distilled water was added to the microcapsules, which were then redispersed to obtain a suspension. Formic acid was added dropwise to this suspension to adjust the pH of the system to 3. Thus, a microcapsule type hardening accelerator was produced in which the amino groups present on the surface of the shells and in the inner parts thereof had been blocked with formic acid. The microcapsule type hardening accelerator thus obtained was taken out by centrifuging, repeatedly washed with water, and then dried. Thus, the microcapsule type hardening accelerator was isolated as free-flowing powder particles. The average particle diameter, shell thickness, and core content of the microcapsule type hardening accelerator obtained are shown in Table 1.

TABLE 1

| Formulation (parts by weight) | (a) | (b) | (c) | (d) | (e) |
|---|---|---|---|---|---|
| Isocyanate monomer (X) | 57.7 | 153.4 | | | |
| Isocyanate monomer (Y) | 134.1 | 38.4 | 38.4 | | 143.9 |
| Isocyanate monomer (Z) | | | 115.1 | 143.9 | |
| Polyamine | 28.8 | 28.8 | 28.8 | 28.8 | 28.8 |
| Dispersion stabilizer | 24 | 24 | 24 | | |
| Hardening accelerator | 61.7 | 61.7 | 61.7 | 61.7 | 61.7 |
| Toluene | 16 | 16 | 16 | 16 | 16 |
| Distilled water | 516 | 516 | 516 | 516 | 516 |
| Average particle diameter of microcapsule type hardening accelerator (μm) | 3 | 3 | 3 | 3 | 3 |
| Shell thickness of microcapsule type hardening accelerator (μm) | 0.4 | 0.4 | 0.4 | 0.4 | 0.4 |
| Core content of microcapsule type hardening accelerator (wt %) | 30 | 30 | 30 | 30 | 30 |

[Hardening Accelerator]
Triphenylphosphine

EXAMPLES 1 TO 4 AND COMPARATIVE EXAMPLES 1 AND 2

The ingredients shown in Table 2 were mixed together according to each of the formulations shown in the table by means of a universal stirring tank at 80° C. The resultant mixtures each were filtered through a 400-mesh filter and then degassed under vacuum for 30 minutes to produce the target epoxy resin compositions for semiconductor sealing. The exothermic peak temperature due to reaction for each of the thermosetting resin compositions obtained was measured with a differential scanning calorimeter (PyTisl, manufactured by Perkin-Elmer Corp.) at a heating rate of 10° C./min in the manner described above.

Figure 4:
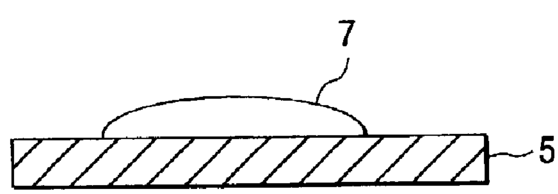
FIG. 4 is a diagrammatic sectional view illustrating one step in a solder wetting test.
Figure 5:
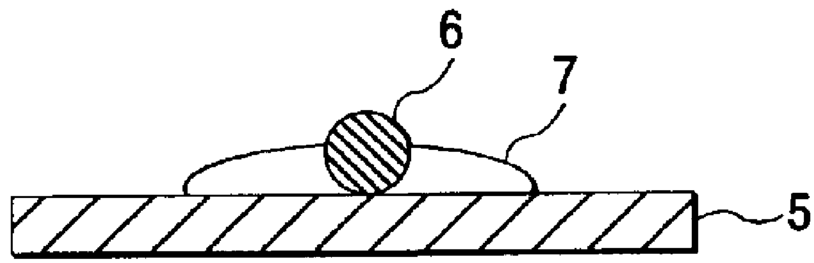
FIG. 5 is a diagrammatic sectional view illustrating another step in a solder wetting test.
Figure 6:
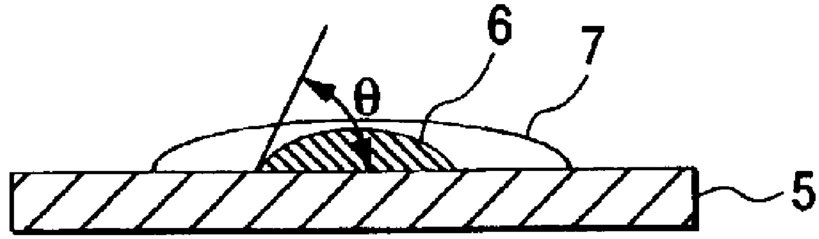
FIG. 6 is a diagrammatic sectional view illustrating still another step in a solder wetting test.

The thermosetting resin compositions thus obtained in the Examples and Comparative Examples were subjected to a solder wetting test. In the test, each thermosetting resin composition 7 was applied to a preflux-coated copper plate 5 which had been surface-treated with a preflux (WLF 16, manufactured by Tamura Kaken) as shown in FIG. 4, and this copper plate 5 was placed on an 80° C. hot plate. Ten solder balls 6 [manufactured by Senju Metal Industry; 63Sn-37Pb solder (melting point, 183° C.); Sn—Ag solder (melting point, 220° C.); ball diameter, 500 μm] were added to the thermosetting resin composition 7 as shown in FIG. 5. This copper plate 5 was then placed for 1 minute on a 200° C. hot plate in the case of the 63Sn-37Pb solder or on a 240° C. hot plate in the case of the Sn—Ag solder. Thus, the solders were melted and connected to obtain test samples shown in FIG. 6. In each test sample, the number of junctions thus formed from the solder balls 6 was counted, and the contact angle θ between a solder ball 6 connected and the preflux-coated copper plate 5 was measured to evaluate the wetting properties of each solder.

TABLE 2

| | Formulation | Example | | | | Comparative Example | |
|---|---|---|---|---|---|---|---|
| | (parts by weight) | 1 | 2 | 3 | 4 | 1 | 2 |
| Composition | Epoxy resin | 150.8 | 150.8 | 150.8 | 150.8 | 150.8 | 150.8 |
| | Phenolic resin | 80 | 80 | 80 | 80 | 80 | 80 |
| | Microcapsule type hardening accelerator (a) | 3.2 | | | | | |
| | Microcapsule type hardening accelerator (b) | | 3.2 | | | | |
| | Microcapsule type hardening accelerator (c) | | | 3.2 | | | |
| | Microcapsule type hardening accelerator (d) | | | | 3.2 | | |
| | Microcapsule type hardening accelerator (e) | | | | | | 3.2 |
| | Hardening accelerator (TPP) | | | | | 0.96 | |
| | Flux activator | 12.4 | 12.4 | 12.4 | 12.4 | 12.4 | 12.4 |
| Test results | DSC peak temperature (° C.) | 186 | 193 | 228 | 247 | 160 | 175 |
| | Number of junctions (63Sn-37Pb) (number of junctions/total number) | 10/10 | 10/10 | 10/10 | 10/10 | 2/10 | 7/10 |
| | Average contact angle of solder connected (63Sn-37Pb) (°) | 17 | 12 | 11 | 11 | 23 | 21 |
| | Number of junctions (Ag—Sn) (number of junctions/total number) | 3/10 | 4/10 | 10/10 | 10/10 | 0/10 | 0/10 |
| | Average contact angle of solder connected (Ag—Sn) (°) | 48 | 47 | 38 | 36 | — | — |

Table 2 shows the following. In the soldering test, the solder balls in the Examples were superior to those in the Comparative Examples in the property of wetting the copper plate and in the proportion of junctions formed. Furthermore, the exothermic peaks due to reaction, which were measured with a differential scanning calorimeter, for the thermosetting resin compositions obtained in the Examples were observed at higher temperatures than those for the thermosetting resin compositions obtained in the Comparative Examples. It was thus ascertained that the exothermic peak due to reaction for a thermosetting resin composition, as measured by differential scanning calorimetry, can be controlled by suitably selecting a composition of the shells of the microcapsule type hardening accelerator. It was further ascertained that in the soldering test for each solder, the thermosetting resin compositions showing an exothermic peak due to reaction at a temperature higher than the melting point of the solder attained a higher proportion of junctions formed.

The thermosetting resin composition of the invention is characterized by containing a flux ingredient and a microcapsule type hardening accelerator having a latent hardening function. When the thermosetting resin composition of the invention is used for tightly filling the space between a semiconductor element and a wiring board in producing a semiconductor device of a face-down structure, then resin sealing/metallic junction formation can be easily carried out without via the complicated steps heretofore in use which comprise connecting the bumps of a semiconductor element to the electrodes of a wiring board with a metal using a flux and then injecting a sealing resin into the space between the semiconductor element and the wiring board. The composition hence produces an effect that semiconductor devices can be produced with high productivity.

While the invention has been described in detail and with reference to specific embodiments thereof, it will be apparent to one skilled in the art that various changes and modifications can be made therein without departing from the spirit and scope thereof.

What is claimed is:

1. A thermosetting resin composition which comprises:

(A) an epoxy resin having at least two epoxy groups per molecule;

(B) a hardener;

(C) a compound represented by the following general formula (1) or (2):

$$R^1—(COO—CH(CH_3)—O—R^2)_n \quad (1)$$

$$CH_2{=}CH—O—R^4—O—CH(CH_3)—(OCO—R^3—COO—CH(CH_3)—OR^4—O—CH(CH_3))_n—OCO—R^3—COO—CH(CH_3)—OR^4—O—CH{=}CH_2 \quad (2)$$

wherein n is a positive integer, and $R^1$, $R^2$, $R^3$ and $R^4$ each represent an organic group having a valence of 1 or higher and may be the same or different; and (D) a microcapsule type hardening accelerator comprising microcapsules each having a structure made up of a core comprising a hardening accelerator and a shell covering the core and comprising a polymer having a structural unit represented by the following general formula (3):

$$—N(R^5)—CO—N(R^6)— \quad (3)$$

wherein $R^5$ and $R^6$ each represent a hydrogen atom or a monovalent organic group and may be the same or different, and which, when examined by differential scanning calorimetry at a heating rate of 10° C./min, shows an exothermic peak due to reaction in the range of from 180 to 250° C.

2. The thermosetting resin composition as claimed in claim 1, wherein said epoxy resin to be used as ingredient (A) is at least one resin selected from the group consisting of bisphenol A epoxy resins, bisphenol F epoxy resins, novolac epoxy resins, alicyclic epoxy resins, nitrogen-containing ring epoxy resins, hydrogenated bisphenol A epoxy resins, aliphatic epoxy resins, glycidyl ether epoxy resins, bisphenol S epoxy resins, biphenyl epoxy resins, dicyclo epoxy resins, and naphthalene epoxy resins.

3. The thermosetting resin composition as claimed in claim 2, wherein said epoxy resin is at least one resin selected from the group consisting of bisphenol A epoxy resins, bisphenol F epoxy resins, naphthalene epoxy resins, alicyclic epoxy resins, and triglycidyl isocyanurate.

4. The thermosetting resin composition as claimed in claim 1, wherein said epoxy resin has an epoxy equivalent of from 90 to 1,000 g/eq.

5. The thermosetting resin composition as claimed in claim 1, wherein said epoxy resin has a softening point of from 50 to 160° C.

6. The thermosetting resin composition as claimed in claim 1, wherein said hardener to be used as ingredient (B) is at least one hardener selected from the group consisting of a phenolic hardener, acid anhydride hardeners, amines, and benzoxazine ring compounds.

7. The thermosetting resin composition as claimed in claim 6, wherein said phenolic hardener is at least one hardener selected from the group consisting of cresol novolac resins, phenolic novolac resins, dicyclopentadiene ring phenolic resins, phenol-aralkyl resins, and naphthol.

8. The thermosetting resin composition as claimed in claim 6, wherein said epoxy resin and the phenolic hardener are incorporated in such ratios that the amount of the reactive hydroxyl groups in the phenolic hardener is from 0.5 to 1.5 equivalent per equivalent of the epoxy groups of the epoxy resin.

9. The thermosetting resin composition as claimed in claim 1, wherein $R^1$ in general formula (1) is selected from the group consisting of alkyl groups having 1 to 30 carbon atoms, alkylene groups having 2 to 8 carbon atoms, a vinyl group, an allyl group, a phenyl group, a phenylene group, aromatic ring groups having a valence of 3 or higher, and a $C_3N_3(OCOC_2H_4)_3$ group.

10. The thermosetting resin composition as claimed in claim 1, wherein $R^2$ in general formula (1) is selected from the group consisting of alkyl groups having 1 to 10 carbon atoms, cycloalkyl groups having 3 to 8 carbon atoms, and aromatic ring groups.

11. The thermosetting resin composition as claimed in claim 1, wherein $R^3$ in general formula (2) is selected from the group consisting of functional groups having a structure represented by any of formulae (4) to (7):

$$—(CH_2)_n— \quad (4)$$

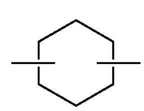

(5)

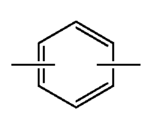

(6)

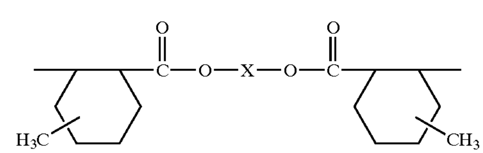

(7)

wherein n is a positive integer and X is a bivalent organic group.

12. The thermosetting resin composition as claimed in claim 1, wherein $R^4$ in general formula (2) is selected from the group consisting of functional groups having a structure represented by any of formulae (8) to (10):

$$-\!\!(CH_2)_n\!\!- \quad (8)$$

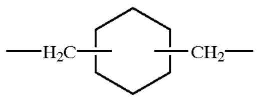

(9)

$$-\!\!(CH_2CH_2O)_n\!\!- \quad (10)$$

wherein n is a positive integer.

13. The thermosetting resin composition as claimed in claim 1, wherein a proportion of the compound represented by general formula (1) or (2) to be used as ingredient (C) is from 0.1 to 20 parts by weight per 100 parts by weight of all resins.

14. The thermosetting resin composition as claimed in claim 13, wherein the proportion of the compound represented by general formula (1) or (2) is from 0.5 to 15 parts by weight per 100 parts by weight of all resins.

15. The thermosetting resin composition as claimed in claim 1, wherein said hardening accelerator is at least one compound selected from the group consisting of tertiary amines, imidazole compounds, phosphorus compounds, quaternary ammonium salts, organometallic salts, and derivatives thereof.

16. The thermosetting resin composition as claimed in claim 15, wherein said hardening accelerator is selected from the group consisting of imidazole compounds and organophosphorus compounds.

17. The thermosetting resin composition as claimed in claim 1, wherein said polymer having a structural unit represented by general formula (3) is obtained by the addition polymerization reaction of a polyisocyanate with a polyamine.

18. The thermosetting resin composition as claimed in claim 17, wherein said polyisocyanate is at least one compound selected from the group consisting of diisocyanates, triisocyanates, tetraisocyanates, an adduct of 2,4-hexamethylene diisocyanate with Brenzcatechol, an adduct of tolylene diisocyanate with hexanetriol, an adduct of tolylene diisocyanate with trimethylolpropane, an adduct of xylylene diisocyanate with trimethylolpropane, an adduct of hexamethylene diisocyanate with trimethylolpropane, and isocyanate prepolymers.

19. The thermosetting resin composition as claimed in claim 17, wherein said polyamine is at least one compound selected from the group consisting of diethylenetriamine, triethylenetetramine, tetraethylenepentamine, 1,6-hexamethylenediamine, 1,8-octamethylenediamine, 1,12-dodecamethylenediamine, o-phenylenediamine, m-phenylenediamine, p-phenylenediamine, o-xylylenediamine, m-xylylenediamine, p-xylylenediamine, menthanediamine, bis(4-amino-3-methylcyclohexyl) methane, isophoronediamine, 1,3-diaminocyclohexane, and spiroacetal-series diamines.

20. The thermosetting resin composition as claimed in claim 1, wherein said polymer having a structural unit represented by general formula (3) is obtained by reacting a polyisocyanate with water.

21. The thermosetting resin composition as claimed in claim 20, wherein said polyisocyanate is at least one compound selected from the group consisting of diisocyanates, triisocyanates, tetraisocyanates, an adduct of 2,4-hexamethylene diisocyanate with Brenzcatechol, an adduct of tolylene diisocyanate with hexanetriol, an adduct of tolylene diisocyanate with trimethylolpropane, an adduct of xylylene diisocyanate with trimethylolpropane, an adduct of hexamethylene diisocyanate with trimethylolpropane, and isocyanate prepolymers.

22. The thermosetting resin composition as claimed in claim 1, wherein $R^5$ and $R^6$ in general formula (3) each is selected from a group consisting of a hydrogen atom, alkyl groups having 1 to 3 carbon atoms and aryl groups.

23. The thermosetting resin composition as claimed in claim 1, wherein an amount of the microcapsule type hardening accelerator is from 0.1 to 40 parts by weight per 100 parts by weight of the hardener.

24. A semiconductor device obtained through sealing with the thermosetting resin composition of claim 1.

* * * * *

UNITED STATES PATENT AND TRADEMARK OFFICE

CERTIFICATE OF CORRECTION

PATENT NO. : 6,916,538 B2 
APPLICATION NO. : 10/392836
DATED : July 12, 2005
INVENTOR(S) : Hiroshi Noro and Mitsuaki Fusumada It is certified that error appears in the above-identified patent and that said Letters Patent is hereby corrected as shown below:

In claim 1, please make the following amendment to the general formula (2):

Col. 15, Line 43

$$\mathrm{CH_2{=}CH\text{-}O\text{-}R^4\text{-}O\text{-}CH(CH_3)\text{-}(OCO\text{-}R^3\text{-}COO\text{-}CH(CH_3)\text{-}OR^4\text{-}O\text{-}CH(CH_3)\underline{)}_n\text{-}OCO\text{-}R^3\text{-}COO\text{-}CH(CH_3)\text{-}OR^4\text{-}O\text{-}CH{=}CH_2}$$

Signed and Sealed this

Twentieth Day of February, 2007

JON W. DUDAS

*Director of the United States Patent and Trademark Office*